(12) United States Patent
Zemberyová

(10) Patent No.: US 10,624,249 B1
(45) Date of Patent: Apr. 14, 2020

(54) ELECTROMAGNETIC RADIATION SHIELDING IN GARMENTS

(71) Applicant: Andrea Zemberyová, Grünwald (DE)

(72) Inventor: Andrea Zemberyová, Grünwald (DE)

( * ) Notice: Subject to any disclaimer, the term of this patent is extended or adjusted under 35 U.S.C. 154(b) by 0 days.

(21) Appl. No.: 15/396,671

(22) Filed: Jan. 1, 2017

(51) Int. Cl.
*H05K 9/00* (2006.01)
*A41D 27/20* (2006.01)
*G21F 3/02* (2006.01)

(52) U.S. Cl.
CPC ........... *H05K 9/009* (2013.01); *A41D 27/205* (2013.01); *G21F 3/02* (2013.01); *A41D 2400/26* (2013.01)

(58) Field of Classification Search
USPC ..................................................... 250/516.1
See application file for complete search history.

(56) References Cited

U.S. PATENT DOCUMENTS

| | | | | |
|---|---|---|---|---|
| 6,738,265 B1 * | 5/2004 | Svarfvar | .................. | D04C 1/06 174/358 |
| 6,843,078 B2 * | 1/2005 | Rock | ........................ | D04B 1/04 66/202 |
| 8,082,762 B2 * | 12/2011 | Burr | ......................... | D04B 1/14 66/171 |
| 8,161,826 B1 * | 4/2012 | Taylor | ....................... | G01L 1/18 73/862.044 |
| 10,119,208 B2 * | 11/2018 | McMaster | ................ | D04B 1/14 |
| 2003/0106346 A1 * | 6/2003 | Matsumoto | ............ | D04B 21/10 66/195 |
| 2003/0224681 A1 * | 12/2003 | Koch | ........................ | G21F 3/02 442/131 |
| 2012/0047631 A1 | 3/2012 | Connolly | | |
| 2014/0130243 A1 | 5/2014 | Falken et al. | | |
| 2018/0263302 A1 * | 9/2018 | Dratva | ................. | A41D 13/008 |

OTHER PUBLICATIONS

R. W. Evans, "Design Guidelines for Shielding Effectiveness, Current Carrying Capability, and the Enhancement of Conductivity of Composite Materials", NASA Contractor Report 4784, Aug. 1997, pp. 35-37, National Aeronautics and Space Administration Marshall Space Flight Center • MSFC, Alabama 35812, USA.

A.-L. Apreutesei, A. Curteza, O. Baltag, "Study of the Knitted Structures with Different Designs used for Electromagnetic Shielding", The 9th International Symposium on Advanced Topics in Electrical Engineering, May 7-9 2015, pp. 352-355, 978-1-4799-7514-3/15, IEEE.

* cited by examiner

*Primary Examiner* — Phillip A Johnston

(57) ABSTRACT

A method of producing a garment having at least one electromagnetic radiation shielded zone and a corresponding garment are disclosed.

8 Claims, 7 Drawing Sheets

ELECTROMAGNETIC RADIATION SHIELDING IN GARMENTS

FIELD OF THE INVENTION

The present invention relates generally to the field of electromagnetic radiation shielding and in particular to a method of producing a garment having at least one electromagnetic radiation shielded zone and a corresponding garment.

BACKGROUND OF THE INVENTION

The number of wireless devices in use is currently estimated at around 7.9 billion globally and it is expected that it will continue growing to around 11.6 billion by the end of 2020. It is suspected that a long-term exposure to electromagnetic radiation emitted by such wireless devices can have harmful effects on human body. Despite that, their use has become indispensable for our modern life and people will continue to use them more and more extensively.

Proper shielding can help protect against electromagnetic radiation and the resulting harmful effects. Different solutions related to electromagnetic radiation shielding have been developed in this area during the past years. They were designed to shield electromagnetic radiation in the form of a case on the wireless device, by affixing a shielding layer to the garment, as a radiation blocking portable pouch, or through the use of a hands-free device.

For instance, the prior art document US Pub. No. 2014/0130243 A1 to Falken et al. discloses a garment with a sewn-in one-layer pocket which creates a shield between the wearer and a wireless device placed inside the pocket.

Another prior art document US Pub. No. 2012/0047631 A1 to Kohler Connolly discloses a garment outfitted with a liner insert for a pocket to be shielded, said liner insert being attached to the inner side of the pocket either by ironing, applying pressure, stitching, or using Velcro.

However, known prior art electromagnetic radiation protection solutions do not provide the necessary protection in a convenient manner. In particular, the prior art solutions require that an electromagnetic radiation shielding layer be incorporated as a replacement part of a garment (like the inner side of the pocket in US Pub. No. 2014/0130243 A1 to Falken et al.), or as an additional layer to a part of a garment (like the liner in US Pub. No. 2012/0047631 A1 to Kohler Connolly), presenting a means to house a wireless device in a manner that changes the traditional construction of the garment and impairs the convenience of wearing.

The present invention thus aims at providing a solution to the technical problems identified above.

BRIEF SUMMARY OF THE INVENTION

The present invention provides a method of producing a garment having at least one electromagnetic, EM, radiation shielded zone and a corresponding garment as set out in respective independent claims. Preferred embodiments are defined by the appended dependent claims.

BRIEF DESCRIPTION OF THE DRAWINGS

The following drawings illustrate the exemplary aspects for carrying out the present invention. Like reference numerals refer to like parts in different views of the present invention in the drawings.

DETAILED DESCRIPTION OF THE INVENTION

The present invention is described herein in the context of an EM radiation shielding arrangement for a back pocket for jeans, although those skilled in the art will recognize that the invention may also be used in various other garments, like formal or casual trousers, jackets, shirts, coats, skirts, dresses, suits, underwear, etc.

Figure 1:
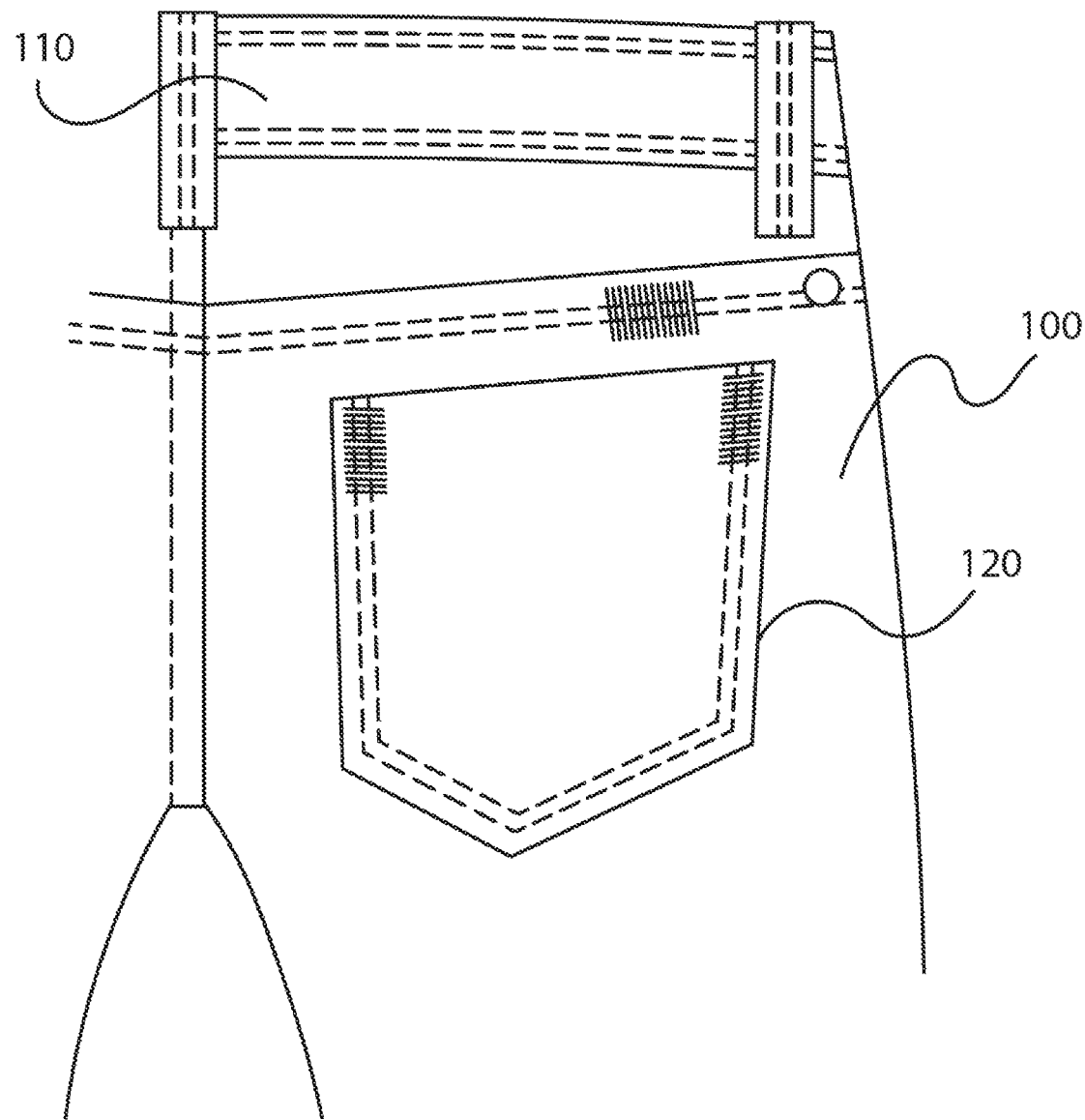
FIG. 1 is a perspective view of an upper-right portion of a conventional garment, such as jeans, seen from the back.

Referring to FIG. 1, a conventional garment, such as jeans, is shown. In particular, FIG. 1 illustrates the back view of an upper-right portion of conventional jeans including a body (100), a waistband (110) and a pocket (120) with an opening on top, all made of a suitable fabric.

In the following, the first aspect of the present invention is described referring to FIGS. 2a to 2c. It relates to the method of producing a garment having at least one EM radiation shielded zone.

Figure 2A:
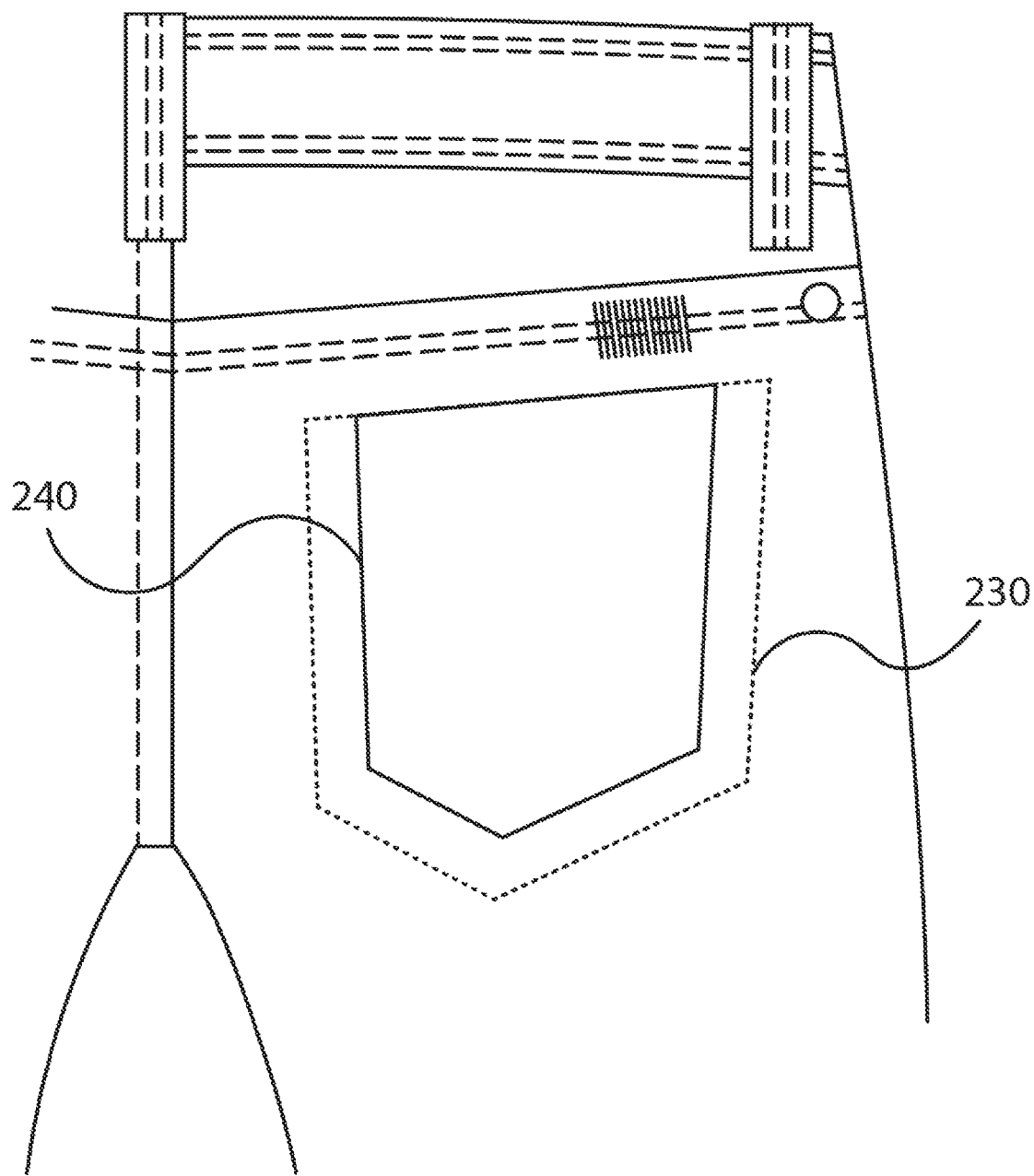
FIGS. 2a to 2d are a perspective view of an upper-right portion of a garment according to the present invention, seen from the back.

First, at least one EM radiation shielded zone (240) of a garment is determined in relation to at least one designated area (230) of said garment as shown in FIG. 2a. The designated area defines an area of said garment designated to form the inner side of a pocket suitable to accommodate a device emitting EM radiation.

The inner side of the pocket may be defined as the area covered by the outer side of the pocket. Thus, said designated area represents an area defining the placement of the pocket on the garment. For one garment, it may be desired to design the right back pocket to be the pocket providing EM radiation shielding, for another garment, it may be desired to design the left back pocket to be the pocket providing EM radiation shielding. Multiple pockets, for instance both left and right pockets, may be desired to be designed to provide EM radiation shielding.

The at least one EM radiation shielded zone represents the area of said garment which physically exhibits EM radiation shielding properties. There may be just one EM radiation shielded zone in relation to said at least one designated area, or there may be multiple EM radiation shielded zones in relation to said at least one designated area.

In one example, said at least one EM radiation shielded zone may be identical to said at least one designated area. In another example, said at least one EM radiation shielded zone may be formed within said at least one designated area. In yet another example, said at least one EM radiation shielded zone may be formed outside said at least one designated area. In yet another example, said at least one EM radiation shielded zone may extend said at least one designated area. In yet another example, said at least one EM shielded radiation zone may have a smaller surface than said at least one designated area. In yet another example, said at least one EM shielded radiation zone may have a larger surface than said at least one designated area.

In one aspect of the present invention, said at least one EM radiation shielded zone is determined based on predicted location of the wireless device's at least one antenna.

Next, an EM radiation shielding treatment to at least a part of said at least one EM radiation shielded zone is applied.

Applying an EM radiation shielding treatment to said at least a part of said at least one EM radiation shielded zone may comprise applying a pattern to said at least a part of said at least one EM radiation shielded zone. In other words, a pattern which exhibits EM radiation shielding properties is applied to said at least a part of said at least one EM radiation shielded zone.

Said pattern may be formed of a conductive yarn. Any conductive yarn can be used to form said pattern, for instance cotton, or polyester with micro fine stainless steel fibres, such as Bekinox BK 50/2, or Bekinox BK 50/1 made by Bekaert NV, Belgium. Other types of conductive yarns may be employed, which incorporate conductive fibres (metal, carbon, nanotubes, or other, or a combination thereof). In principle, a pattern formed of any type of a conductive yarn will exhibit EM radiation shielding properties. It is however preferred that the conductive yarn is resistant to machine and hand washing.

There are various options of how said pattern may be applied. These may be stitching, sewing, embroidering, or any combination thereof. In detail, a conductive yarn is repeatedly passed through the fabric of a garment, either with use of a needle or a similar device, from one (outer) side of the fabric to the other (inner) side of the fabric and vice versa, to form said pattern. Stitching, sewing and embroidering represent various well-known techniques of how the yarn is passed through a fabric and will not be explained here in detail.

The pattern may be of a substantially polygonal shape. It may also be of a substantially circular shape, of a substantially ellipsoidal shape, of a substantially radial shape, or of substantially any other geometrical shape. A combination of multiple shapes is also possible, for instance a combination of any of a substantially polygonal, a substantially circular, a substantially ellipsoidal, a substantially radial and a substantially any other geometrical shapes. The pattern may however also be fully, or partially, random.

Figure 2B:
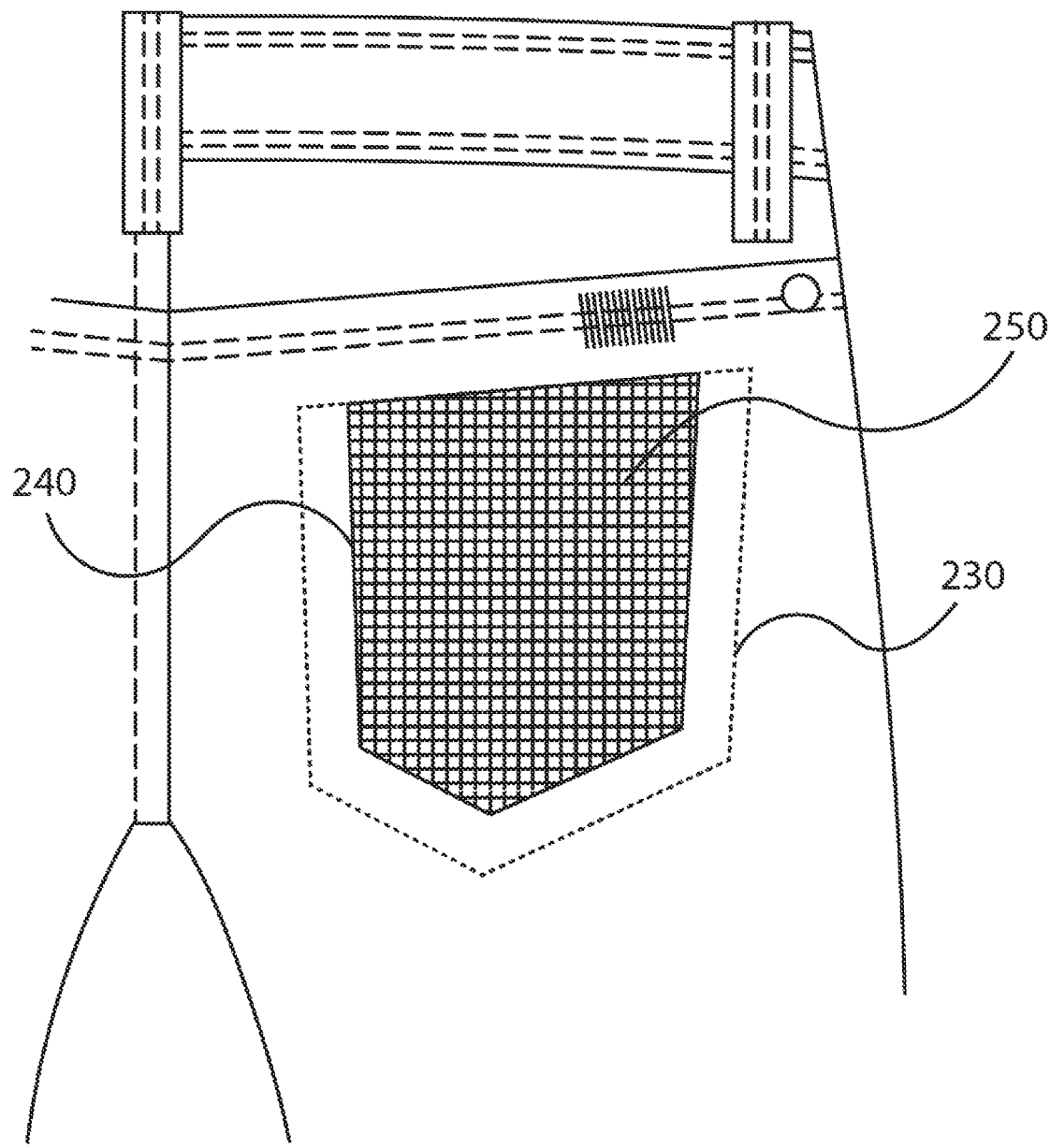

In one particular example, said pattern (250) is a grid, as shown in FIG. 2b without the outer side of the pocket applied. This pattern is especially convenient to implement, as it is relatively easy to apply and it provides a good predicted shielding efficiency.

In detail, the shielding efficiency of a grid pattern may be approximately defined as:
for far fields, $$d \geq \frac{\lambda}{2\pi}:$$

$$SE_{E,H}[dB] = 20k\log\left(\frac{\lambda}{2\,g}\right) \quad \text{(Eq. 1)}$$

for near fields, $$d < \frac{\lambda}{2\pi}:$$

$$SE_E[dB] = 20k\log\left(\frac{\lambda^2}{4\pi dg}\right) \quad \text{(Eq. 2)}$$

-continued $$SE_H[dB] = 20k\log\left(\frac{\pi d}{g}\right) \quad \text{(Eq. 3)}$$

wherein $\lambda$, is the wavelength of the EM radiation waves, g is the grid spacing and d is the distance between the EM radiation source and the EM shielding grid. Parameter k is related to the grid conductivity, i.e. the conductivity of the yarn and the grid's connecting points, and can have a value between 0 and 1. If the grid conductivity is very high, the k approaches 1. Due to the logarithmic nature of the Equations 1 to 3, a shielding efficiency of 6 dB represents an attenuation of the signal strength of 50%, a shielding efficiency of 20 dB represents an attenuation of the signal strength of 90%.

Figure 2C:
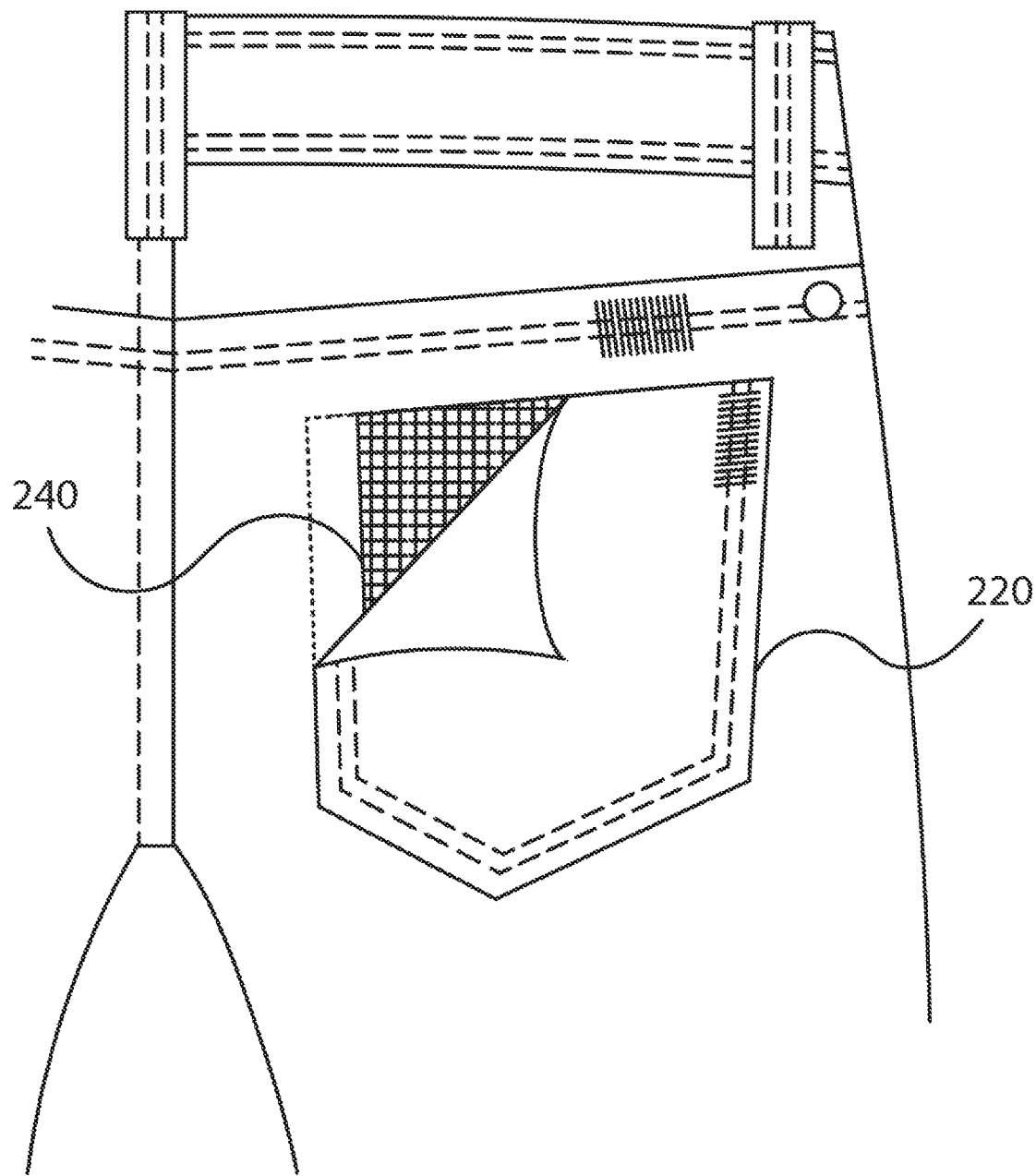

Referring to FIG. 2c, the detailed perspective view of the garment pocket (220) with the EM radiation shielding produced according to the method of the present invention is shown. As can be seen in FIG. 2c, the upper-left corner of the pocket is flipped open to better illustrate the application of the pattern (in this particular example the grid illustrated in FIG. 2b) to said at least a part of said at least one EM radiation shielded zone (240) according to the inventive concept underlying the present invention.

In another particular example, said pattern is a mesh. Various other patterns are possible, as previously explained.

Figure 2D:
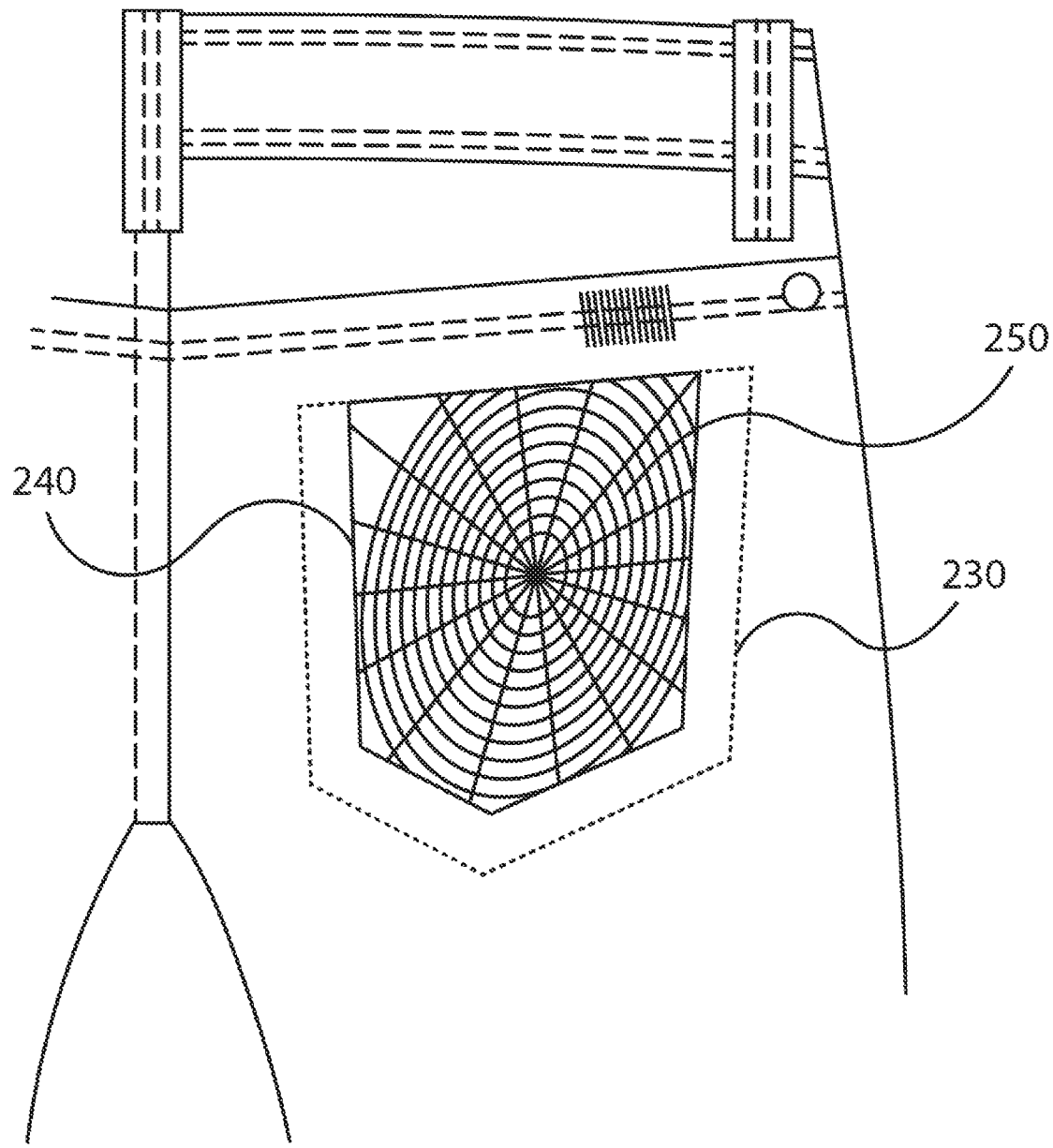

FIG. 2d illustrates an another example of a pattern applied to said at least a part of said at least one EM radiation shielded zone shown without the outer side of the pocket applied.

Said EM radiation shielding treatment may be applied to at least a part of said at least one EM radiation shielded zone as previously explained, but may also be applied to substantially whole said at least one EM radiation shielded zone.

Figure 3:
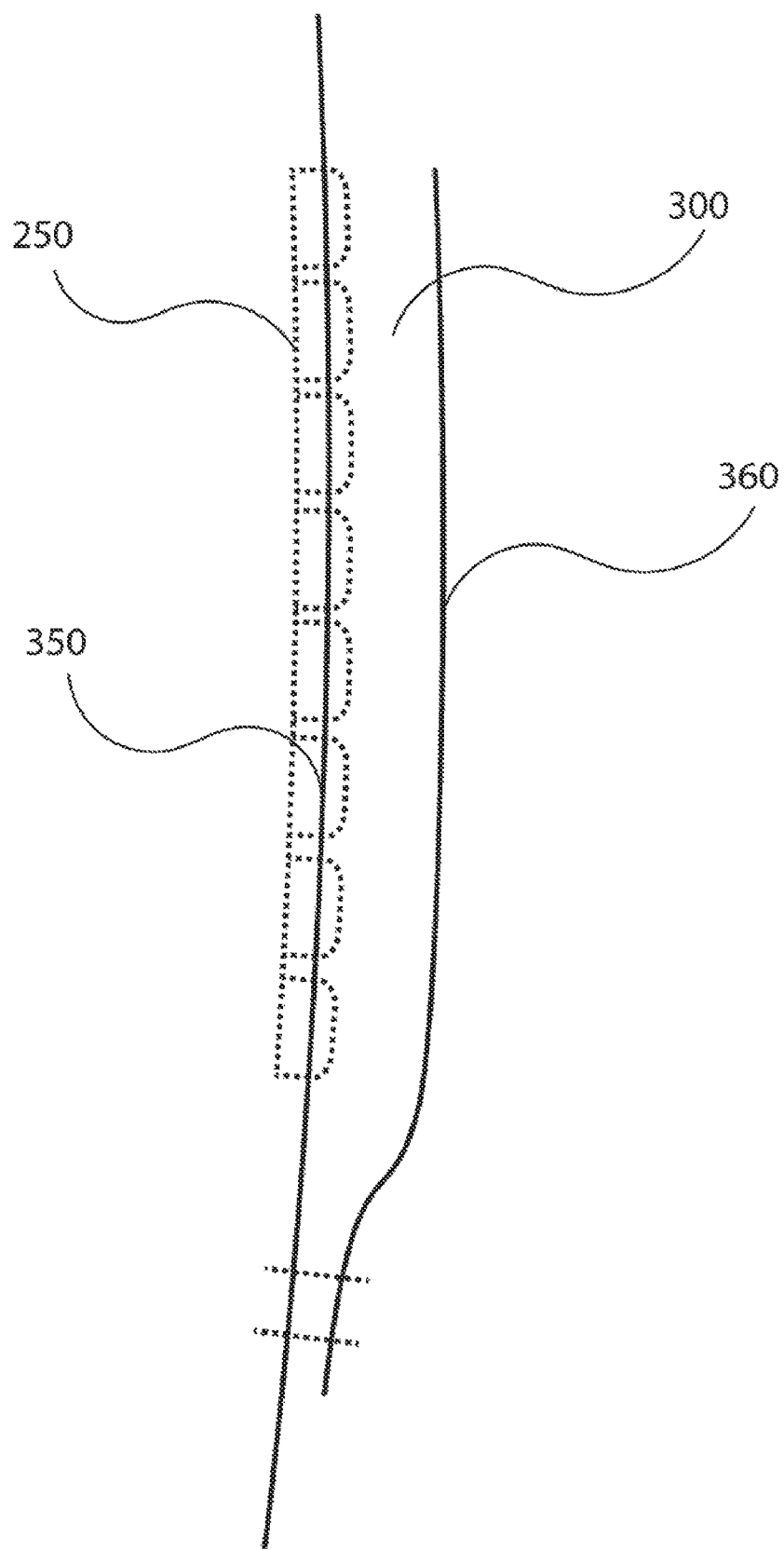
FIG. 3 is a cross-sectional view of a pocket with the EM radiation shielded zone according to one example of the present invention.

Referring to FIG. 3, a cross-sectional view of the pocket (220) with the EM radiation shielding according to the present invention is shown. The pocket is formed of two opposite walls, attached to each other along its edges to form a pocket space (300) between them. The first wall (350) is referred to as the inner side of the pocket and the second wall (360) is referred to as the outer side of the pocket. Solid lines in FIG. 3 are used to depict a fabric whereas dotted lines are used to depict a yarn.

There are various arrangements of the pockets possible. For a conventional sewn-in pocket, both walls hang on the inner side of the garment, adjacent the inner side of the garment fabric. This is a usual arrangement for a more formal type of garment. For a conventional sewn-on pocket, such as the one illustrated in FIG. 3, the inner side of the pocket is formed on the garment body itself and the outer side of the pocket is sewn onto the garment body such that it faces exactly the inner side of the pocket. This arrangement is usual for a more casual, or less formal, type of garment, such as jeans. The present invention can equally be applied to both sewn-in as well as sewn-on types of pockets.

Referring back to FIG. 3, said pattern (250) is shown in the cross-sectional view of the pocket (220) to be formed of a conductive yarn being repeatedly passed through the fabric of the garment. In this particular example, one line of a grid is shown in the cross-sectional view in FIG. 3 being stitched in the garment fabric.

The method of producing a garment according to the present invention is suitable for producing the garment during the industrial production process as well as for producing the garment after the industrial production process has been completed. It is however preferable to apply the method during the production process as the determined EM radiation shielded zones are easier to access.

Figure 4:
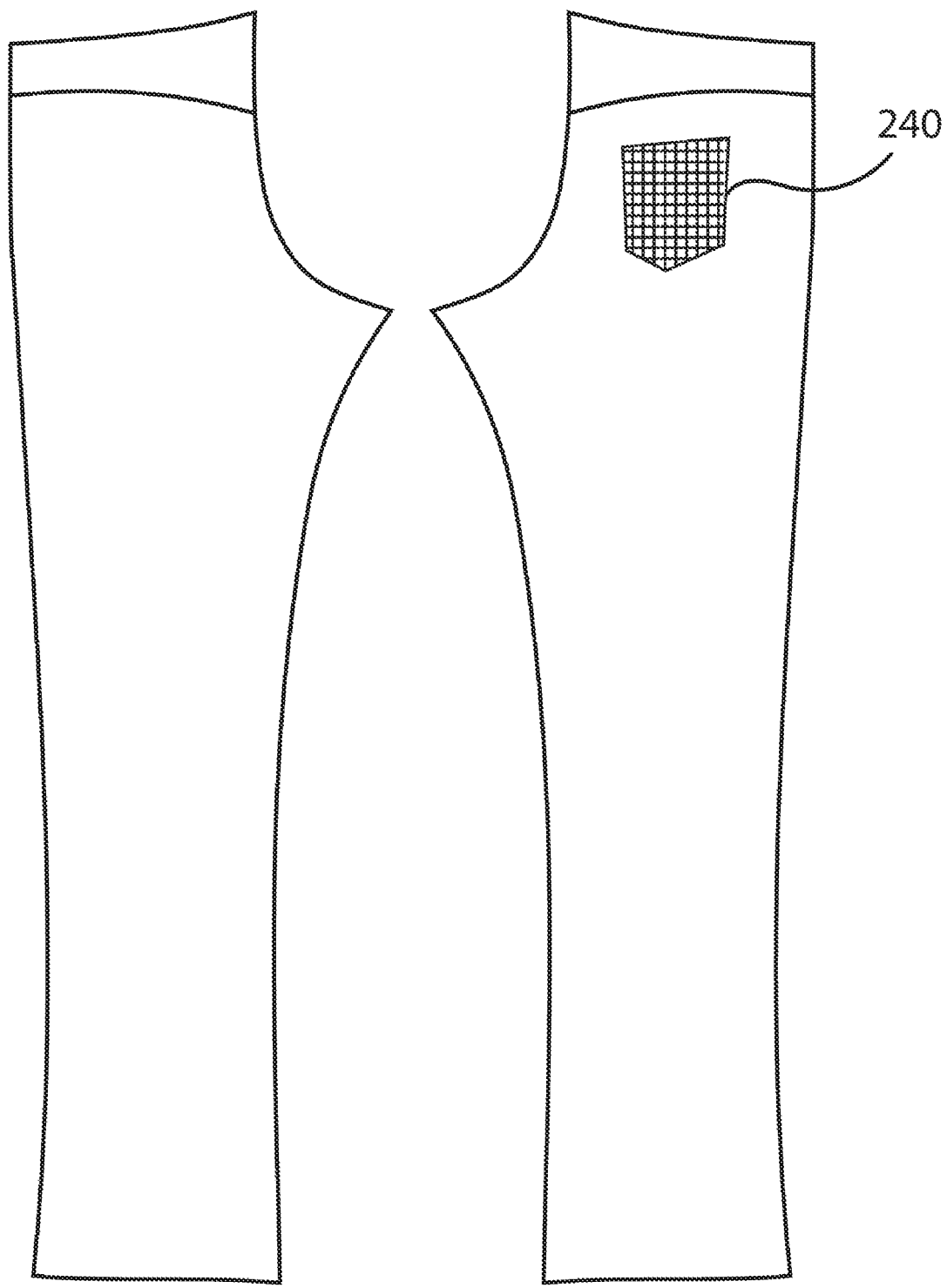
FIG. 4 is illustrating the application of the method of the present invention during an industrial garment production process.

Referring now to FIG. 4, the application of the method during the industrial garment production process is explained.

First, at least one EM radiation shielded zone (240) of a garment is determined in relation to at least one designated area (not shown) of said garment. As previously explained, the designated area defines an area of said garment designated to form the inner side of a pocket suitable to accommodate a device emitting EM radiation. In other words, said designated area defines the inner side of the pocket providing EM radiation shielding.

In the example of FIG. 4, the right back pocket is desired to be designed to be the pocket providing EM radiation shielding.

As previously explained, the at least one EM radiation shielded zone represents the area on said garment which physically exhibits EM radiation shielding properties.

Next, an EM radiation shielding treatment to at least a part of said at least one EM radiation shielded zone is applied, as previously explained. The subsequent steps in garment production process remain the same as those of a conventional garment production, i.e. cutting, sewing-on the outer sides of the pockets including the outer sides of the pockets to be sewn onto the at least one designated area, assembling, etc.

Various modifications to the present invention described will be obvious to a person skilled in the art without departing from the scope of the invention as defined by the appended claims.

The invention claimed is:

1. A method of producing a garment having at least one electromagnetic, EM, radiation shielded zone (240), the method comprising:
  determining at least one EM radiation shielded zone (240) of a garment, said at least one EM radiation shielded zone (240) being determined in relation to at least one designated area (230) of said garment, said designated area (230) being an area designated to form the inner side of a pocket (120) suitable to accommodate a device emitting EM radiation, said at least one EM radiation shielded zone (240) being identical to, or being formed within, or extending said designated area (230); and
  applying an EM radiation shielding treatment to at least a part of said at least one EM radiation shielded zone (240), wherein said applying an EM radiation shielding treatment to at least a part of said at least one EM radiation shielded zone (240) comprises applying a pattern (250) to said at least a part of said at least one EM radiation shielded zone (240), said pattern (250) being formed of a conductive yarn, wherein applying said pattern (250) comprises repeatedly passing said conductive yarn through the fabric of said garment to form said pattern (250) and wherein said applying an EM radiation shielding treatment to at least a part of said at least one EM radiation shielded zone (240) comprises applying the EM radiation shielding treatment to substantially whole said at least one EM radiation shielded zone (240).

2. The method of claim 1 wherein said at least one EM radiation shielded zone (240) has a smaller surface than said designated area (230).

3. The method of claim 1 wherein said at least one EM radiation shielded zone (240) has a larger surface than said designated area (230).

4. The method of claim 1 wherein said at least one EM radiation shielded zone is determined based on predicted location of said device's at least one antenna.

5. The method of claim 1 wherein said pattern (250) is applied by at least one of stitching, embroidering, or sewing, or a combination thereof.

6. The method of claim 1, said pattern (250) being at least one of a substantially polygonal shape, a substantially circular shape, a substantially ellipsoidal shape, a substantially radial shape, or a combination thereof.

7. The method of claim 1, wherein said pattern (250) is a grid, or a mesh.

8. A garment produced according to any one of claims 1, 2 to 4, 5, 6 and 7.

\* \* \* \* \*